(12) United States Patent
Voronin et al.

(10) Patent No.: US 12,158,374 B2
(45) Date of Patent: Dec. 3, 2024

(54) TIME-RESOLVED OES DATA COLLECTION

(71) Applicant: Tokyo Electron Limited, Tokyo (JP)

(72) Inventors: Sergey Voronin, Albany, NY (US); Andrej Mitrovic, Chandler, AZ (US); Blaze Messer, Albany, NY (US); Yan Chen, Fremont, CA (US); Joel Ng, Fremont, CA (US); Ashawaraya Shalini, Fremont, CA (US); Ying Zhu, Fremont, CA (US); Da Song, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 74 days.

(21) Appl. No.: 17/973,083

(22) Filed: Oct. 25, 2022

(65) Prior Publication Data

US 2024/0133742 A1 Apr. 25, 2024
US 2024/0230409 A9 Jul. 11, 2024

(51) Int. Cl.
*G01J 3/44* (2006.01)
*G01J 3/02* (2006.01)
*G01J 3/443* (2006.01)

(52) U.S. Cl.
CPC ............ *G01J 3/443* (2013.01); *G01J 3/0205* (2013.01)

(58) Field of Classification Search
CPC .. G01J 3/443; G01J 3/0205; G01J 3/28; G01J 3/02; G01J 3/44
See application file for complete search history.

(56) References Cited

U.S. PATENT DOCUMENTS

| | | | |
|---|---|---|---|
| 3,059,611 | A | 10/1962 | Fury et al. |
| 3,612,692 | A | 10/1971 | Kruppa et al. |
| 4,147,435 | A | 4/1979 | Habegger |
| 5,014,217 | A | 5/1991 | Savage |
| 5,308,414 | A | 5/1994 | O'Neill et al. |
| 5,347,460 | A | 9/1994 | Gifford et al. |
| 5,353,790 | A | 10/1994 | Jacques et al. |

(Continued)

FOREIGN PATENT DOCUMENTS

| | | |
|---|---|---|
| CN | 1482578 A | 3/2004 |
| CN | 101038860 A | 9/2007 |

(Continued)

OTHER PUBLICATIONS

International Search Report and Written Opinion, PCT Application No. PCT/US2023/029877, mailed Nov. 27, 2023, 10 pages.

(Continued)

*Primary Examiner* — Abdullahi Nur
(74) *Attorney, Agent, or Firm* — Slater Matsil, LLP

(57) ABSTRACT

A method of processing a substrate that includes: exposing the substrate in a plasma processing chamber to a plasma powered by applying a first power to a first electrode of a plasma processing chamber; turning OFF the first power to the first electrode after the first time duration; while the first power is OFF, applying a second power to a second electrode of the plasma processing chamber for a second time duration, the second time duration being shorter than the first time duration, an energy of the second power over the second time duration is less than an energy of the first power over the first time duration by a factor of at least 2; and detecting an optical emission spectrum (OES) from species in the plasma processing chamber.

20 Claims, 8 Drawing Sheets

(56) References Cited

U.S. PATENT DOCUMENTS

| | | | |
|---|---|---|---|
| 5,450,205 A | 9/1995 | Sawin et al. | |
| 5,517,312 A | 5/1996 | Finarov | |
| 5,648,198 A | 7/1997 | Shibata | |
| 5,658,423 A | 8/1997 | Angell et al. | |
| 5,751,416 A | 5/1998 | Singh et al. | |
| 5,807,761 A | 9/1998 | Coronel et al. | |
| 5,885,472 A | 3/1999 | Miyazaki et al. | |
| 5,980,767 A | 11/1999 | Koshimizu et al. | |
| 6,060,328 A | 5/2000 | En et al. | |
| 6,081,334 A | 6/2000 | Grimbergen et al. | |
| 6,090,302 A | 7/2000 | Smith, Jr. et al. | |
| 6,132,577 A | 10/2000 | Smith, Jr. et al. | |
| 6,374,832 B2 | 4/2002 | Chow et al. | |
| 6,381,008 B1 | 4/2002 | Branagh et al. | |
| 6,535,779 B1 | 3/2003 | Birang et al. | |
| 6,564,114 B1 | 5/2003 | Toprac et al. | |
| 6,582,618 B1 | 6/2003 | Toprac et al. | |
| 6,673,200 B1 | 1/2004 | Gu et al. | |
| 6,703,250 B2 | 3/2004 | Chiu | |
| 6,745,095 B1 | 6/2004 | Ben-Dov et al. | |
| 6,815,653 B2 | 11/2004 | Tsay et al. | |
| 6,825,920 B2 | 11/2004 | Lam et al. | |
| 6,830,939 B2 | 12/2004 | Harvey et al. | |
| 6,911,157 B2 | 6/2005 | Edamura et al. | |
| 6,952,657 B2 | 10/2005 | Jahns et al. | |
| 6,958,484 B2 | 10/2005 | Mitrovic | |
| 6,969,619 B1 | 11/2005 | Winniczek | |
| 7,030,335 B2 | 4/2006 | Hoffman et al. | |
| 7,241,397 B2 | 7/2007 | Fink et al. | |
| 7,312,865 B2 | 12/2007 | Chen | |
| 7,328,126 B2 | 2/2008 | Chamness | |
| 7,334,477 B1 | 2/2008 | Pirkle | |
| 7,403,930 B2 | 7/2008 | Ho | |
| 7,591,923 B2 | 9/2009 | Mitrovic et al. | |
| 7,824,519 B2 * | 11/2010 | Wang | H01J 37/32458 118/723 R |
| 7,906,032 B2 | 3/2011 | Yamashita | |
| 7,959,970 B2 | 6/2011 | Gaudet et al. | |
| 8,048,326 B2 | 11/2011 | Yue et al. | |
| 8,154,721 B2 | 4/2012 | Chen et al. | |
| 8,158,017 B2 | 4/2012 | Hudson | |
| 8,173,451 B1 | 5/2012 | Tian et al. | |
| 8,415,884 B2 | 4/2013 | Chen et al. | |
| 8,416,509 B2 | 4/2013 | Yi et al. | |
| 8,486,290 B2 | 7/2013 | Morisawa et al. | |
| 8,513,583 B2 | 8/2013 | Corke et al. | |
| 8,553,218 B2 | 10/2013 | Tinnemans et al. | |
| 8,877,080 B2 | 11/2014 | Chen et al. | |
| 8,883,024 B2 | 11/2014 | Chen et al. | |
| 9,200,950 B2 | 12/2015 | Lian et al. | |
| 9,209,950 B2 | 12/2015 | Uo et al. | |
| 9,330,990 B2 | 5/2016 | Chen et al. | |
| 9,760,008 B2 | 9/2017 | Devilliers | |
| 9,842,726 B2 | 12/2017 | Daniels et al. | |
| 9,899,278 B2 | 2/2018 | Ishikawa | |
| 10,436,717 B2 | 10/2019 | Omstead et al. | |
| 10,453,653 B2 | 10/2019 | Chen et al. | |
| 10,692,705 B2 | 6/2020 | Mihaylov et al. | |
| 10,832,979 B2 | 11/2020 | Howald et al. | |
| 2001/0046769 A1 | 11/2001 | Chow et al. | |
| 2002/0029851 A1 | 3/2002 | Edamura et al. | |
| 2003/0005943 A1 | 1/2003 | Singh et al. | |
| 2003/0132195 A1 | 7/2003 | Edamura et al. | |
| 2004/0008336 A1 | 1/2004 | Lam et al. | |
| 2004/0026035 A1 | 2/2004 | Mitrovic | |
| 2004/0058359 A1 | 3/2004 | Mei et al. | |
| 2004/0104681 A1 | 6/2004 | Mitrovic et al. | |
| 2004/0235303 A1 | 11/2004 | Wong et al. | |
| 2005/0241669 A1 | 11/2005 | Wodecki | |
| 2006/0006139 A1 | 1/2006 | Johnson | |
| 2006/0285108 A1 | 12/2006 | Morrisroe | |
| 2007/0128876 A1 | 6/2007 | Fukiage | |
| 2007/0238199 A1 | 10/2007 | Yamashita | |
| 2008/0186473 A1 | 8/2008 | Lee | |
| 2008/0285202 A1 | 11/2008 | Boyd et al. | |
| 2009/0029489 A1 | 1/2009 | Park et al. | |
| 2009/0065025 A1 | 3/2009 | Urbanowicz et al. | |
| 2009/0280581 A1 | 11/2009 | Hudson | |
| 2009/0325387 A1 | 12/2009 | Chen et al. | |
| 2010/0081285 A1 | 4/2010 | Chen et al. | |
| 2011/0139748 A1 | 6/2011 | Donnelly et al. | |
| 2011/0174776 A1 | 7/2011 | Kabe et al. | |
| 2012/0006351 A1 | 1/2012 | Jun et al. | |
| 2012/0085494 A1 | 4/2012 | Uchida et al. | |
| 2012/0091097 A1 | 4/2012 | Chen et al. | |
| 2012/0101622 A1 | 4/2012 | Yun et al. | |
| 2012/0175060 A1 | 7/2012 | Hudson et al. | |
| 2013/0016344 A1 | 1/2013 | Bullock et al. | |
| 2013/0141720 A1 | 6/2013 | Park et al. | |
| 2014/0097359 A1 | 4/2014 | Vasic et al. | |
| 2014/0106477 A1 | 4/2014 | Chen et al. | |
| 2014/0209453 A1 | 7/2014 | Jun et al. | |
| 2015/0069912 A1 | 3/2015 | Valcore, Jr. et al. | |
| 2015/0160557 A1 | 6/2015 | deVilliers | |
| 2015/0241272 A1 | 8/2015 | Lian et al. | |
| 2016/0126068 A1 | 5/2016 | Lee et al. | |
| 2016/0233135 A1 | 8/2016 | Ishikawa | |
| 2016/0268108 A1 | 9/2016 | Daniels et al. | |
| 2016/0314943 A1 | 10/2016 | Albarede et al. | |
| 2017/0140905 A1 * | 5/2017 | Mihaylov | H01J 37/32917 |
| 2018/0053661 A1 * | 2/2018 | Park | H01J 37/32715 |
| 2020/0058470 A1 | 2/2020 | Ventzek et al. | |
| 2020/0135458 A1 | 4/2020 | Mehrotra et al. | |
| 2020/0168443 A1 * | 5/2020 | Oh | H01L 21/3065 |
| 2024/0136164 A1 * | 4/2024 | Voronin | H01J 37/32926 |

FOREIGN PATENT DOCUMENTS

| | | |
|---|---|---|
| CN | 101221891 A | 7/2008 |
| CN | 102788916 A | 11/2012 |
| CN | 102282654 B | 10/2013 |
| CN | 103117202 B | 9/2015 |
| EP | 0756318 A1 | 1/1997 |
| EP | 0652415 B1 | 12/1998 |
| JP | H05226296 A | 9/1993 |
| JP | H08106992 A | 4/1996 |
| JP | H09266097 A | 10/1997 |
| JP | 2005527984 A | 9/2005 |
| JP | 2015532544 A | 11/2015 |
| JP | 2016146384 A | 8/2016 |
| JP | 2016541119 A | 12/2016 |
| KR | 20120126418 A | 11/2012 |
| TW | 589659 B | 6/2004 |
| TW | 201435621 A | 9/2014 |
| WO | 02091453 A1 | 11/2002 |
| WO | 2005111265 A1 | 11/2005 |
| WO | 2015130433 A1 | 9/2015 |

OTHER PUBLICATIONS

De Schepper et al. "Pattern Roughness Mitigation of 22 nm Lines and Spaces: The Impact of a H2 Plasma Treatment" Plasma Processes and Polymers, Sep. 2014, 10 pages.

Economou, "Pulsed plasma etching for semiconductor manufacturing", Journal of Physics D: Appl Physics, vol. 47, 303001, Jul. 1, 2014, 27 pages.

Goodlin, "Multivariate Endpoint Detection of Plasma Etching Processes" Dissertation presented Apr. 2002, at Massachusetts Institute of Technology, pp. 1-226.

Goodlin et al. "Quantitative Analysis and Comparison of Endpoint Detection Based on Multiple Wavelength Analysis" 201st Meeting of the Electrochemical Society, International Symposium on Plasma Processing XIV, Abs. 415, May 2002, pp. 1-30.

Lee, Master's Thesis presented at University of California, Berkeley, Jul. 1, 2000, 69 pages.

Park et al. "Electron characterization in weakly ionized collisional plasmas: from principles to techniques", Advances in Physics, vol. 4, No. 1, 1526114, Oct. 23, 2018, 53 pages.

Selwyn, "Optical Diagnostic Techniques for Plasma Processing" AVS Press, 1993, Relevant chapter 3 on Optical Emission Spectroscopy (OES) is provided, pp. 26-80 with title and bibliographic information pages.

(56) References Cited

OTHER PUBLICATIONS

Shannon et al. "A Spatially Resolved Optical Emission Sensor Plasma Etch Monitoring" Appl. Phys. Lett., vol. 71 No. 11, Sep. 1997, pp. 1467-1468.
Ventzek et al. "Formation, Nature, and Stability of the Arsenic-Silicon-Oxygen Alloy for Plasma Doping of Non-Planar Silicon Structures" Applied Physics letters, vol. 105, 2014, pp. 262102-1-262102.
White, "Multivariate Analysis of Spectral Measurements for the Characterization of Semiconductor Processes" Dissertation presented Apr. 2002, at Massachusetts Institute of Technology, pp. 1-357.
White et al. "Low-Open Area Endpoint Detection using a PCA based T2 Statistic and Q Statistic on Optical Emission Spectroscopy Measurements" IEEE Transactions on Semiconductor Manufacturing, vol. 13 No. 2, May 2000, pp. 1-30.
Yamaguchi et al. "Direct current superposed dual-frequency capacitively coupled plasmas in selective etching of SiOCH over SiC", Journal of Physics D Applied Physics, Dec. 2011, 25 pages.
Yue et al. "Plasma Etching Endpoint Detection Using Multiple Wavelengths for Small Open-Area Wafers" J. Vac. Sci. Technol. A, vol. 19 No. 1, 2001, pp. 66-75.

\* cited by examiner

TIME-RESOLVED OES DATA COLLECTION

CROSS-REFERENCE TO RELATED APPLICATIONS

This application is related to application Ser. No. 17/972,958, filed on Oct. 25, 2022, which application is hereby incorporated herein by reference.

TECHNICAL FIELD

The present invention relates generally to systems and methods of processing a substrate, and, in particular embodiments, to time-resolved optical emission spectroscopy (OES) data collection.

BACKGROUND

Generally, a semiconductor device, such as an integrated circuit (IC) is fabricated by sequentially depositing and patterning layers of dielectric, conductive, and semiconductor materials over a substrate to form a network of electronic components and interconnect elements (e.g., transistors, resistors, capacitors, metal lines, contacts, and vias) integrated in a monolithic structure. Process flows used to form the constituent structures of semiconductor devices often involve depositing and removing a variety of materials while a pattern of several materials may be exposed in a surface of the working substrate.

Advanced process control that involves in-situ process characterization and fault detection in semiconductor manufacturing is essential for reproducible production of complex structures. As the minimum dimension of features in a patterned layer has shrunk periodically and new materials have been introduced in ICs, the need for improved process characterization to assure process compliance and cost reduction has increased.

SUMMARY

In accordance with an embodiment of the present invention, a method of processing a substrate that includes: exposing the substrate in a plasma processing chamber to a plasma powered by applying a first power to a first electrode of a plasma processing chamber; turning OFF the first power to the first electrode after the first time duration; while the first power is OFF, applying a second power to a second electrode of the plasma processing chamber for a second time duration, the second time duration being shorter than the first time duration, an energy of the second power over the second time duration is less than an energy of the first power over the first time duration by a factor of at least 2; and detecting an optical emission spectrum (OES) from species in the plasma processing chamber.

In accordance with an embodiment of the present invention, a method of processing a substrate that includes: exposing the substrate in a plasma processing chamber to a plasma powered by applying a pulsed RF power to a first electrode of a plasma processing chamber for a first time duration, the pulsed RF power being pulsed at a first frequency; while the pulsed RF power is OFF during the first time duration, applying a second power including a waveform having a second frequency to a second electrode of the plasma processing chamber; detecting a series of optical emission spectra (OES) from the plasma, the series of OES being detected at time periods correlated to the second frequency of the waveform; and obtaining a characteristic of the plasma based on the series of OES.

In accordance with an embodiment of the present invention, a plasma processing system including: a plasma processing chamber configured to hold a substrate to be processed; a RF power source configured to generate a plasma in the plasma processing chamber; an optical emission spectroscopy (OES) detection device connected to the plasma processing chamber, the OES detection device being configured to measure OES signals from the plasma processing chamber during a process; an electrode connected to the OES detection device; a microprocessor; and a non-transitory memory storing a program to be executed in the microprocessor, the program including instructions to: perform an etch process on a substrate; during the etch process, apply a series of power pulses to the electrode of the plasma processing chamber to excite species in the plasma processing chamber; detecting a series of OES from the excited species from the plasma processing chamber, a timing of detecting the series of OES being correlated to a timing of the series of power pulses; and based on the series of OES, perform a temporal analysis of the excited species during the etch process.

BRIEF DESCRIPTION OF THE DRAWINGS

For a more complete understanding of the present invention, and the advantages thereof, reference is now made to the following descriptions taken in conjunction with the accompanying drawings, in which:

FIGS. 3A-3C illustrate example timing diagrams of one power pulse cycle for a pulsed plasma process and resulting temporal profiles for plasma properties in accordance with various embodiments, wherein FIG. 3A illustrates a timing diagram for source power, FIG. 3B illustrates a timing diagram for a power for OES signal enhancement, and FIG. 3C illustrates the temporal profiles for radical density, electron density, and electron temperature of the plasma;

FIG. 4A-4F illustrates example timing diagrams for a plasma process synchronized with power pulsing for OES signal enhancement in accordance with various embodiments, wherein FIG. 4A illustrates an embodiment with one-to-one power-excitation pulsing pairing, FIG. 4B illustrates another embodiment with reduced excitation pulsing, FIG. 4C illustrates an alternate embodiment with delayed excitation pulsing, FIG. 4D illustrates yet another embodiment with excitation ramping, FIG. 4E illustrates yet another embodiment with excitation pulsing overlapped with source power, and FIG. 4F illustrates yet another embodiment with a plasma-less process;

FIGS. 5A and 5B illustrates process flow charts of methods of OES data collection in accordance with various embodiments, wherein FIG. 5A illustrates an embodiment, and FIG. 5B illustrates another embodiment.

DETAILED DESCRIPTION OF ILLUSTRATIVE EMBODIMENTS

Figure 1:
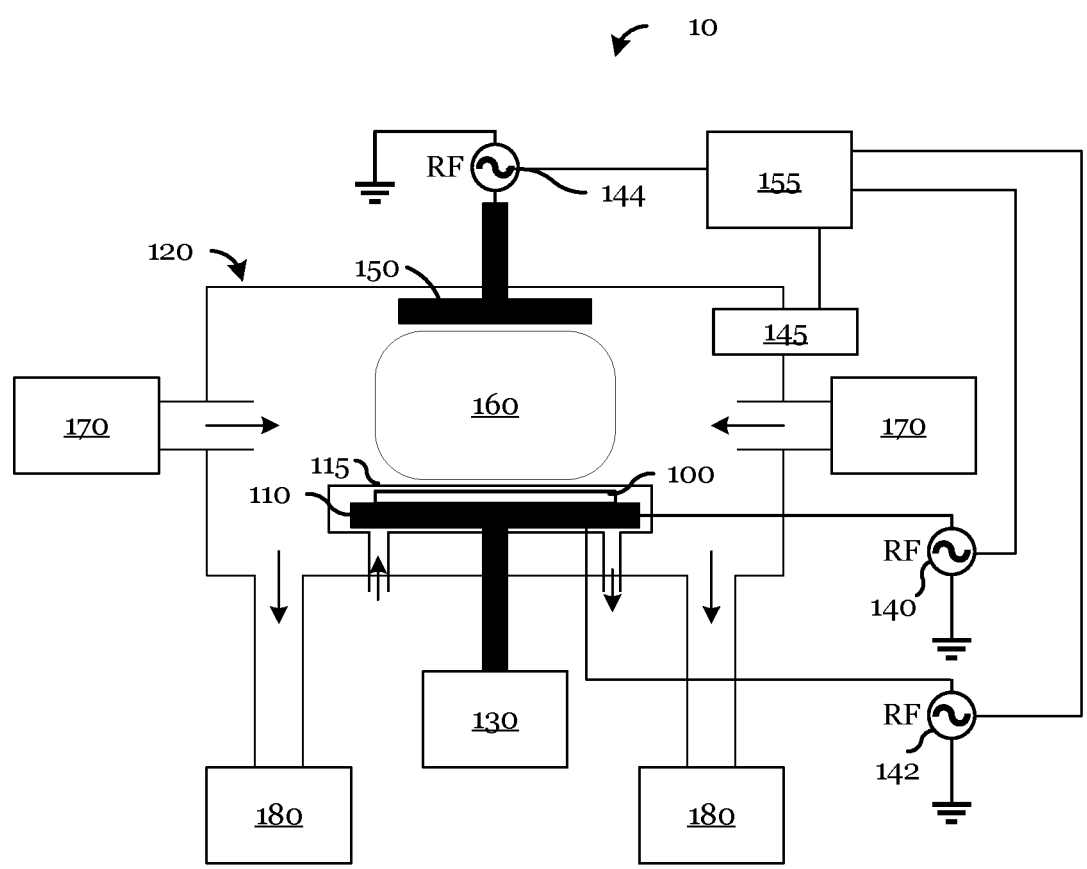
FIG. 1 illustrates an example plasma processing system with an optical emission spectroscopy (OES) configured to operate in synchronization with plasma processing in accordance with various embodiments.

This application relates to systems and methods of process characterization, more particularly to time-resolved optical emission spectroscopy (OES) for advanced process characterization. In particular, the methods of OES data collection may advantageously be applied in a pulsed plasma process, where OES signal intensity can be substantially enhanced for detection specifically during an afterglow period. In semiconductor manufacturing, plasma processing is used at various stages for depositing and etching various materials to construct complex structures with precision at nanometer scale. Because a plasma is a highly energetic and complex system comprising ion and radical species, it is often challenging to accurately characterize the plasma during operation and monitor the progress of a plasma process. Optical emission spectroscopy (OES) is a powerful spectroscopic tool to analyze atoms and ions present in a plasma by detecting optical emission from excited species, and OES systems have been incorporated to some plasma processing systems for process characterization as described in, for example, in U.S. Pat. Nos. 5,862,060 and 10,453,653. For example, using OES to collect light emission signal from process plasmas, endpoint detection (EPD) of a plasma etch process such as reactive ion etching (RIE) and atomic layer etching (ALE) may be achieved.

However, depending on the types of materials being processed and the process parameters, a change of an optical emission spectrum of plasma during the process may be subtle and relatively difficult to detect. Further, some process conditions require very mild or even zero plasma discharge, leading to limited sensitivity of existing OES methods due to insufficient excitation for optical emissions. The sensitivity of OES may also be a significant challenge in pulsed plasma processes, where power ON and OFF phases are quickly switched to enable pulsing plasma discharges. Advanced process characterization based on time-resolved OES diagnostics relies on sufficient OES signal detection. However, the OES signal detection becomes difficult during the power OFF phase of the pulsed plasma process because the plasma may quickly decays with electron temperature rapidly dropping in the afterglow phase. New OES methods with improved sensitivity are therefore desired for advanced process characterization, especially in pulsed plasma, low-powered plasma, or plasma-less processes.

Embodiments of the present application disclose improved methods of OES data collection during a semiconductor processing, in which short duty power spikes (excitation pulsing) are provided to the plasma processing chamber for OES signal enhancement. The methods of OES data collection may be particularly useful in a pulsed plasma process, where each of the short duty power spikes is timed for the power OFF phase (afterglow discharge period) of the pulsed plasma process. The energy provided by the short duty power spikes excites the species in the plasma processing chamber and increase the electron temperature to enable sufficient OES signal detection. Synchronizing the source power pulsing and the short duty power spikes (excitation pulsing) may thereby enable time-resolved OES diagnostics. Because of their low duty, these power spikes advantageously make negligible increase of the time-averaged power in the plasma system, resulting in a minimum impact on the plasma process itself. The methods of OES data collection with short duty power spikes may also be applied to enhance OES signals in a weakly ionized plasma (e.g., continuous wave plasma or power ON phase of a pulsed plasma). The methods may further be extended to a plasma-less process. The methods can also comprise excitation power modulation during the OES acquisition time periods, which enables retrieving additional information on reactions in the plasma processing chamber.

In the following, an example plasma processing system and OES detection device are described referring to FIGS. 1 and 2, respectively. Various example time diagrams for power pulsing for OES signal enhancement, including the effect on plasma property, are then described referring to FIGS. 3A-3C and 4A-4F. Example process flow diagrams are illustrated in FIGS. 5A and 5B. All figures in this disclosure are drawn for illustration purpose only and not to scale.

FIG. 1 illustrates an example plasma processing system 10 with an OES configured to operate in synchronization with plasma processing in accordance with various embodiments.

For illustrative purposes, FIG. 1 illustrates a substrate 100 placed on a substrate holder 110 (e.g., a circular electrostatic chuck (ESC)) inside a plasma processing chamber 120 near the bottom. The substrate 100 may be optionally maintained at a desired temperature using a heater/cooler 115 that surrounds the substrate holder 110. The temperature of the substrate 100 may be maintained by a temperature controller 130 connected to the substrate holder 110 and the heater/cooler 115. The ESC may be coated with a conductive material (e.g., a carbon-based or metal-nitride based coating) so that electrical connections may be made to the substrate holder 110.

Process gases may be introduced into the plasma processing chamber 120 by a gas delivery system 170. The gas delivery system 170 comprises multiple gas flow controllers to control the flow of multiple gases into the chamber. Each of the gas flow controllers of the gas delivery system 170 may be assigned for each of fluorocarbons, noble gases, and/or balancing agents. In some embodiments, optional center/edge splitters may be used to independently adjust the gas flow rates at the center and edge of the substrate 100. The process gases or any exhaust gases may be evacuated from the plasma processing chamber 120 using vacuum pumps 180.

As illustrated in FIG. 1, the substrate holder 110 may be a bottom electrode of the plasma processing chamber 120. In the illustrative example in FIG. 1, the substrate holder 110 is connected to two RF power sources, 140 and 142. In some embodiment, a conductive circular plate inside the plasma processing chamber 120 near the top is the top electrode 150. In FIG. 1, the top electrode 150 is connected to another RF power source 144 of the plasma processing system 10. In various embodiments, all of power sources for plasma processing (e.g., RF power sources 140, 142, and 144) are connected to a control unit 155 to enable a synchronized operation of the power sources. Further, the control unit 155 is also connected to an OES detection device 145. The OES detection device 145 may be disposed at a position to measure the optical emission from the processing region of a plasma 160 between the substrate 100 and the top electrode 150.

In various embodiments, the control unit 155 is configured to enable feedback control of a plasma process, for example, based on a process monitoring using the OES methods. The control unit 155 may comprise a function generator including an appropriate digital and/or analog circuitry such as oscillators, pulse generators, modulators, combiners, and the like. The function generator is capable of generating one or more arbitrary waveforms that may be used for both power modulation of the RF power sources and OES data acquisition. In certain embodiments, some of the power modulation may be performed by the RF power sources themselves instead of the function generator. In such cases, the function generator may generate a pulse train synchronized with the power modulation by the RF power sources for OES data acquisition. In certain embodiments, although not illustrated, additional components (e.g., a broadband amplifier and a broadband impedance matching network) may be connected to the RF power sources.

In certain embodiments, power sources may comprise a DC power source. The RF and/or DC power sources (e.g., the RF power sources 140, 142, and 144) may be configured to generate a continuous wave (CW) RF, pulsed RF, DC, pulsed DC, a high frequency rectangular (e.g., square wave) or triangular (e.g., sawtooth) pulse train, or a combination or superposition of more than one such waveform. In addition, power sources may be configured to generate a periodic function, for example, a sinusoid whose characteristics such as amplitude and frequency may be adjusted during a plasma process.

A typical frequency for the RF source power can range from about 0.1 MHz to about 6 GHz. In certain embodiments, the RF power sources 142 and 144 may be used to provide a low frequency RF power and a high frequency RF power at the same time, respectively.

In this disclosure, the methods of OES are primarily directed to characterizing a low-power plasma process or a plasma-less process. In certain embodiments, the plasma etch process may be carried out using a pulsed plasma. The pulsed plasma in this disclosure refers to any type of plasma where a source power, a bias power, or both is pulsed at any frequency. In various embodiments, a pulsing at a frequency between 0.1 kHz and 100 kHz may be used to modulate the plasma source power or the bias power. In certain embodiments, a RF pulsing at a kHz range may be used to power the plasma. In various embodiments, any duty ratio (e.g., 0.1% to 99.9%) may be used for any plasma tool. In certain embodiments, a moderate duty ratio between 10% to 70% or 10% to 80% may be used for capacitively coupled plasma (CCP), and 3% to 90% for inductively coupled plasma (ICP). In one embodiment, a sinusoidal RF signal of 1 MHz may be modulated with an on-off frequency of 100 Hz. In another embodiment, a DC signal may be modulated with an on-off frequency of 100 Hz. In yet another embodiment, a square DC pulse signal of 1 MHz may be modulated with an on-off frequency of 100 Hz. In an alternate embodiment, cyclic modulation of RF or fast DC pulse waveform may be performed at a lower frequency (e.g., <100 Hz) using an algorithm.

Various configurations may be used for a plasma processing system 10 that is equipped with the OES detection device 145. For example, the plasma processing system 10 may be a capacitively coupled plasma (CCP) system, as illustrated in FIG. 1, or an inductively coupled plasma (ICP) plasma system. In alternate embodiments, the plasma processing system 10 may comprise a resonator such as a helical resonator. Further, microwave plasma (MW) or other suitable systems may also be used. In various embodiments, the RF power, chamber pressure, substrate temperature, gas flow rates and other plasma process parameters may be selected in accordance with the respective process recipe.

Figure 2:
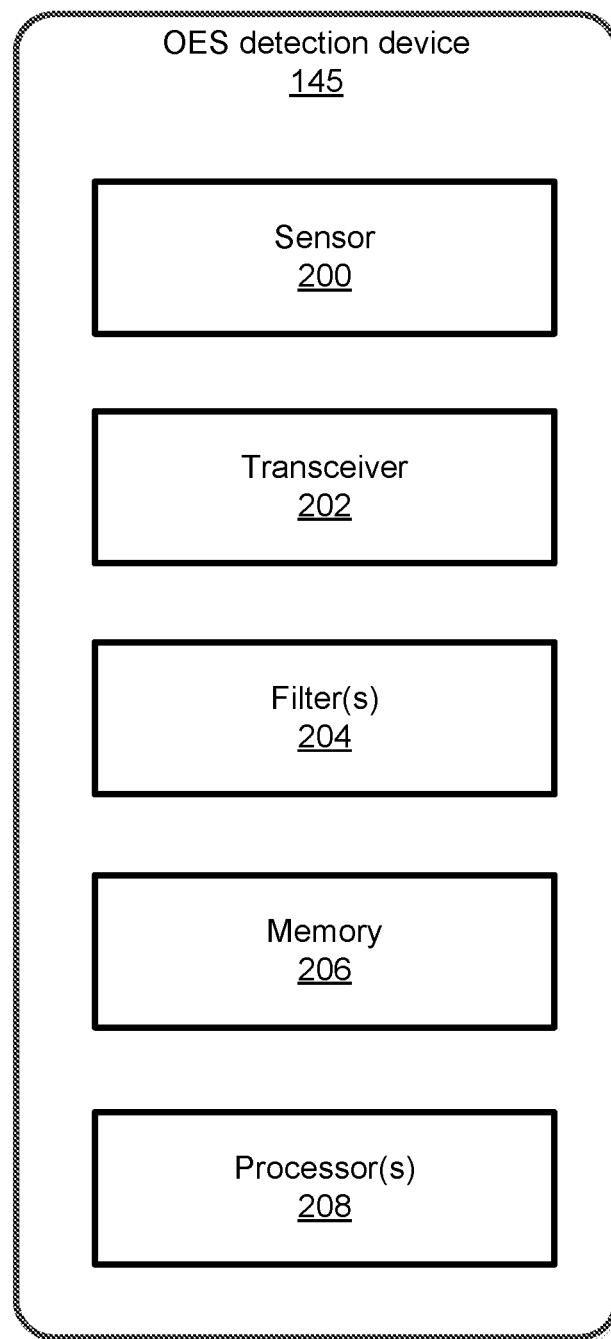
FIG. 2 illustrates a schematic diagram of an OES detection device and their components in accordance with various embodiments.

FIG. 2 illustrates a schematic diagram of an OES detection device 145 and their components in accordance with various embodiments.

The OES detection device 145 may comprise a sensor 200, a transceiver 202, a filter 204, a memory 206, and a processor 208. In various embodiments, the OES detection device 145 may be configured to receive a command from the control unit 155 (FIG. 1) and perform a series of operations accordingly: OES data acquisition at the sensor, receiving the OES data at the transceiver 202, filtering the OES data at the filter 204, and determining a characteristic of the plasma at the processor 208. The characteristic of the plasma may, for example, be plasma density, and/or concentrations of reactive ion species, etch by-product, or other species of interest. The characteristic of the plasma may also include information on electron temperature. In certain embodiments, the OES detection device 145 may be further configured to process the obtained raw OES data by, for example, averaging and/or smoothing prior to determining the characteristic of the plasma.

In acquiring the OES data, the sensor 200 may include, for example, a spectrometer that samples an optical emission spectrum of a plasma. The spectrum, in this example, may include light intensity as a function of wavelength or frequency. The sensor 200 may comprise a charge-coupled device (CCD) sensor, a complementary metal oxide semiconductor (CMOS) image sensor, or other type of light detection device or photosensor may be utilized to measure the light intensity at a plasma processing chamber of the plasma processing system 20. In certain embodiments, the sensor 200 may comprise a CCD sensor with a capability of millisecond time resolution. In another embodiment, the sensor 200 may comprise a CMOS image sensor with a capability of microsecond time resolution.

In various embodiments, the memory 206 may comprise a non-statutory computer-readable storage media for storing instructions which are executed by the processor 208 to perform the various functions described herein. For example, the memory 206 may generally include both volatile memory and non-volatile memory (e.g., RAM, ROM, or the like). The memory 206 may be referred to as memory or computer-readable storage media herein. The memory 206 is capable of storing computer-readable, processor-executable program instructions as computer program code that may be executed by the processor(s) 208 as a particular machine configured for carrying out the operations and functions described in the implementations herein.

The OES detection device 145 is capable of collecting a plurality of wavelengths of optical emission spectra emanating from the glow discharge of gases in the plasma processing chamber. These wavelengths can be associated with the specific chemical species generated from entering reactant gases, can result from gas phase reactions as well as reactions on the wafer and chamber surfaces. The OES detection device 145 may be configured to detect various chemical species including halides of silicon and the halogen species itself (e.g. Cl, F, and Br). In one or more embodiments, the plasma process may comprise etching of silicon oxide using a fluorine-containing chemistry, such as a fluorocarbon or hydrofluorocarbon gas. In such embodiments, it is useful to dynamically detect halides of silicon and the halogen species (F) that are released by the decomposition of the fluorocarbon or hydrofluorocarbon gas in order to monitor the etch process for its process and stability. Other detectable byproducts may include carbon monoxide (CO), and carbon dioxide ($CO_2$), formed by reaction of oxygen (O) from a film or gas mixture with carbon (C) from the fluorocarbon or hydrofluorocarbon gas.

The wavelengths of the optical emission spectra can also shift as the surface composition of the wafer shifts from a steady-state etch to the complete removal of the etched material. In addition to the change in surface composition of the wafer, operating conditions (e.g., gas flow rates, pressure, and power pulsing conditions) can also lead to a shift in the optical emissions spectra. A temporal analysis based on the detection of these shifts may provide useful information about the characteristic of the plasma and thereby the progress of the plasma process.

In various embodiments, the configuration of the OES detection device 145 may be particularly arranged for the type of plasma discharge typically used in the plasma processing system 10. For example, a range of species and wavelengths for detection may be different for high-density ICP, low-density CCP, electron cyclotron resonance (ECR) plasma, and others.

Figure 3A:
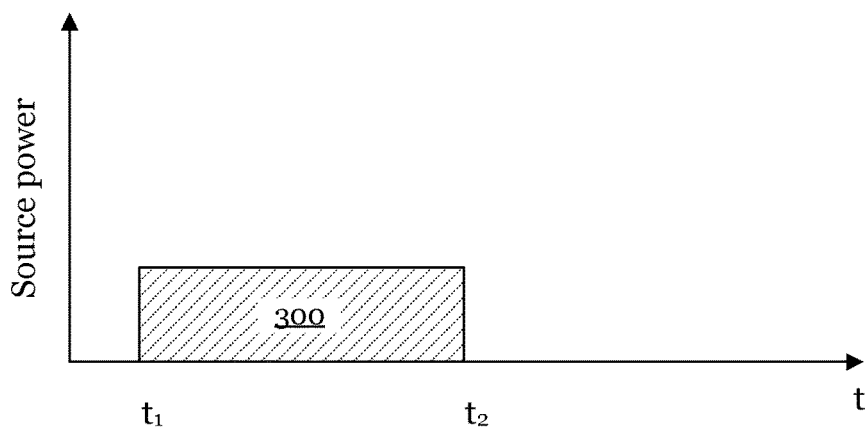
Figure 3B:
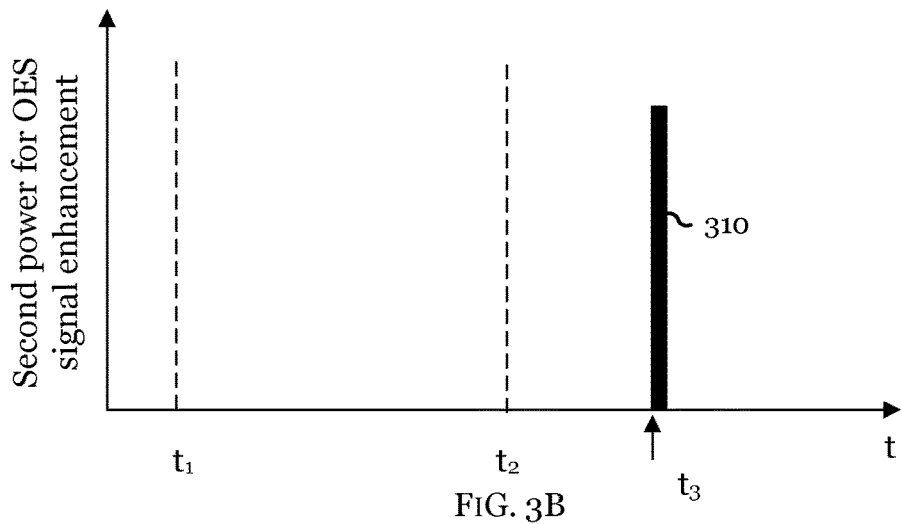
Figure 3C:
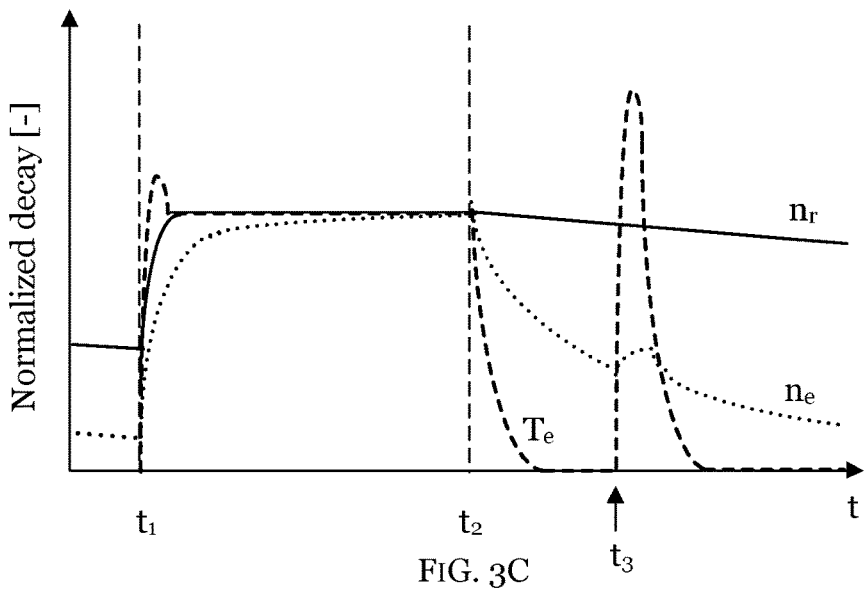

FIGS. 3A-3C illustrate example timing diagrams of one power pulse cycle for a pulsed plasma process and resulting temporal profiles for plasma properties in accordance with various embodiments.

FIG. 3A illustrates an example timing diagram of one power pulse cycle for source power 300. In the illustrated example, the plasma process is based on a pulsed plasma, and diagrams of FIGS. 3A-3C only represents one pulse cycle. In FIG. 3A, the source power 300 is ON from time $t_1$ to time $t_2$ for one cycle. In various embodiments, the source power 300 may be a pulsed RF power pulsed at a frequency between 0.1 kHz and 100 kHz. Accordingly, in one example, the duration from $t_1$ to time $t_2$ may be between 1 μs and 10 ms. Optical emission spectroscopy (OES), despite being a powerful analytical tool to characterize a plasma system, may be challenging when the plasma discharge is relatively weak (e.g., during power OFF phase of a pulsed plasma process, or in a low-power plasma process) due to the insufficient optical emissions from excited species. To overcome this issue of insufficient excitation, the methods introduces one or more power spikes (excitation pulsing) with short duty that can substantially enhance or enable the OES signals.

FIG. 3B illustrates an example timing diagram for a power spike 310 for OES signal enhancement. In FIG. 3B, in accordance with one embodiment, the power spike 310 is provided at time $t_3$, after the power ON phase of the pulse ends at $t_2$. In other words, the power spike 310 may be provided during the power OFF phase. This additional power spike may be provided by powering one or more power sources of the plasma processing chamber (e.g., any one or more of the RF power sources 140, 142, and 144 in FIG. 1). In certain embodiments, it may be the same as the power source used for the source power 300. In other embodiments, it may be a different power source (e.g., bias power source), or a combination thereof. In one or more embodiments, the plasma processing system may comprise a power source dedicated to the OES detection device that may be configured to operate independently from any existing source/bias power sources. Although only one power spike is illustrated in FIG. 3B, as further described below referring to FIGS. 4A-4F, various patterns of a series of power spikes may be used for OES signal enhancement in various embodiments.

In various embodiments, the power spikes 310 in one power cycle may generally be required to satisfy the following criteria: (1) the power level of the power spike is sufficiently high to enable OES signal intensity enhancement in response to the power spike; and (2) the total energy provided by the power spike 310 (i.e., the product of power and time) is substantially lower than the total energy provided by the source power 300 during the one power cycle (e.g., the time duration from $t_1$ to $t_2$) such that the addition of the power spikes 310 does not significantly interfere with the pulsed plasma process. In general, more additional energy will enable greater OES signal enhancement, but it will result in a greater risk of interfering the pulsed plasma process. Therefore, in various embodiments, the process conditions for the power spikes 310 may be carefully selected to balance the two requirements. In certain embodiments, the total energy provided by the power spikes 310 is at most 50% of the total energy provided by the source power 300 during the pulsed plasma process. In other words, the total energy of the power spikes 310 is less than the energy of the source power 300 during the pulsed plasma process by a factor of at least 2. This factor between the two energies may, in another embodiment, be at least 5, or at least 10 in yet another embodiment. In alternate embodiments, the factor may be between 20 and 1000.

In various embodiments, the power spike 310 provides power for a short excitation time $\tau_{ex}$, for example, between 1 μs and 1 ms. In certain embodiments, $\tau_{ex}$ may be between 1 ms and 100 ms. Short excitation time $\tau_{ex}$ may advantageously minimize a potential interference to the low-power plasma process with the power spike 310. Further, in one or more embodiments, the excitation time $\tau_{ex}$ may be shorter than the OES time resolution (i.e., time required to perform one OES measurement). In other embodiments, excitation time $\tau_{ex}$ may be longer than the OES time resolution.

FIG. 3C illustrates the temporal profiles for radical density, electron density, and electron temperature of the plasma.

At the beginning of the power ON phase for the source power 300 at $t_1$, the plasma may be generated in the plasma processing chamber provided that appropriate gases are flowed under an appropriate pressure. The plasma parameters initially change rapidly with time (an overshoot period) before they reaches a stable-ON period. When the power ON phase ends at $t_2$, the plasma parameters generally decay with time. In FIG. 3C, some example temporal normalized decay profiles for radical density ($n_r$), electron density ($n_e$), and electron temperature ($T_e$) are illustrated. In this example, the source power is turned ON at $t_1$ and OFF at $t_2$.

The overshoot period is an initial short transitory period, which indicates a rapid change from the power OFF state to ON state before the plasma becomes stable. During this period, as illustrated in FIG. 3C, the electron temperature $T_e$ may spike before drop to a stable level while radical density ($n_r$) and electron density ($n_e$) may increase without overshoot the stable level. This profile in FIG. 3C is only an example and in other embodiments, any parameters may behave differently (e.g., with or without overshoot). In one embodiment, the overshoot period may be assumed to be an initial 10 μs or less after $t_1$.

The stable-ON period is a subsequent period during which $n_r$, $n_e$, and/or $T_e$ is considered stable, and ends at $t_2$, when the source power is turned OFF. In one embodiment, a parameter is considered stable when a rate of change in the parameter becomes less than a set threshold rate and maintained for at least a set threshold duration.

The decay period (afterglow discharge period) is a period after $t_2$. In the illustrated example, the decay period may be a time duration from $t_2$ until the beginning of a next pulse cycle (not shown in FIGS. 3A-3C), during which $n_r$, $n_e$, and $T_e$ decay at substantially different rates. In one embodiment, the decay time for these parameters to drop to a negligible level may be >1 ms for $n_r$, ~100 μs for $n_e$, and ~10 μs for $T_e$. The pulsing frequency for the source power determines the duration of each pulse. For example, according to certain embodiments, the pulsing frequency in the range of 0.1 kHz and 100 kHz will result in each pulse cycle (ON and OFF phases) is between 10 μs and 10 ms. In one or more embodiments, each pulse cycle may be between 1 ms and 100 ms (i.e., the pulsing frequency of 10 Hz to 1 kHz). Accordingly, depending on the pulsing frequency, it is possible to start the next pulse cycle before or after a parameter (e.g., $n_r$ or $n_e$) decays to a negligible level. In alternate embodiments, although not specifically illustrated in FIGS. 3A, the decay of the plasma parameters may also be a result of reducing the source power from the initial power level to a low power level, instead of completely being turned OFF. In such instances, the decay period is not afterglow discharge period or the power OFF phase, but because the reduced source power may substantially decrease the electron temperature, the OES signals may become too weak for the sufficient measurements. Adding the power spike 310 may therefore be utilized to enhance OES signals in not only the power OFF phase of a pulsed plasma process but also the power ON phase if desired.

Still referring to FIG. 3C, in response to the power spike 310 at $t_3$, species in the plasma processing chamber are excited, and therefore the electron temperature $T_e$ may be spiked for a short period of time. Other parameters (e.g., $n_r$, $n_e$) may also be enhanced in certain embodiments, depending on the duration and power level of the power spike 310. Generally, as illustrated in FIG. 3C, electron temperature $T_e$ may respond most quickly and greatly to the power spike 310 and electron density n e may increase slightly, while the radical density n e may not be substantially affected. In various embodiments, the condition for the power spike 310 may be selected to minimize the impact on the electron density and the radical density. For example, the excitation time $\tau_{ex}$ may be sufficiently short (e.g., in microsecond scale) to influence only the electron temperature. This enhanced excitation reflected in the increase in $T_e$ leads to enhanced OES signal from the excited species. Accordingly, in various embodiments, the power spike 310 for OES signal enhancement may be synchronized with OES measurements such that the OES data collection occurs before the enhanced optical emissions quench back to the original decaying level.

In various embodiments, the power spike 310 and an OES measurement may be simultaneously performed. In certain embodiments, the timing of each OES measurement may be synchronized with the power spikes 310 with a delay (e.g., ~3 ms). Having the delay in synchronization may be advantageous in obtaining more stable OES signals at fully excited phase rather than a transitory phase where the excitation process is still in progress. In other embodiments, a series of OES measurements may be started before the power spike 310 and continuously performed while the power spike 310 is provided.

The number of OES measurements during one cycle of the OES data collection is not limited to any number, and may or may not be equal to the number of the power spike 310, which may be any number.

Figure 4A:
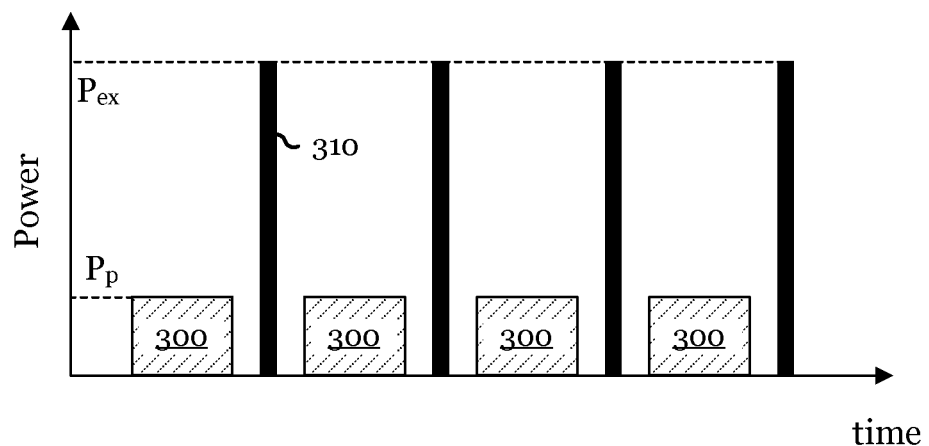

FIG. 4A-4F illustrate example timing diagrams for a plasma process synchronized with power pulsing for OES signal enhancement in accordance with various embodiments. FIG. 4A illustrates an embodiment with one-to-one power-excitation pulsing pairing.

In FIG. 4A, four power pulse cycles for source power 300 with a series of power spikes 310 (excitation pulsing) are illustrated. For each power cycle, during the power OFF phase, one power spike is provided (one-to-one pair). The power spikes 310 are provided with a constant power level with a constant duty ratio in FIG. 4A. In other embodiments, different power pulse patterns may be used for OES signal enhancement as further described below.

Figure 4B:
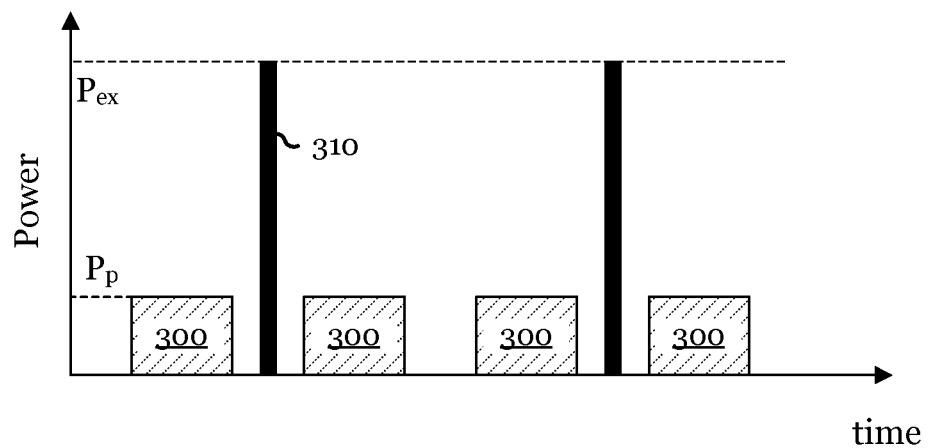
Figure 5A:
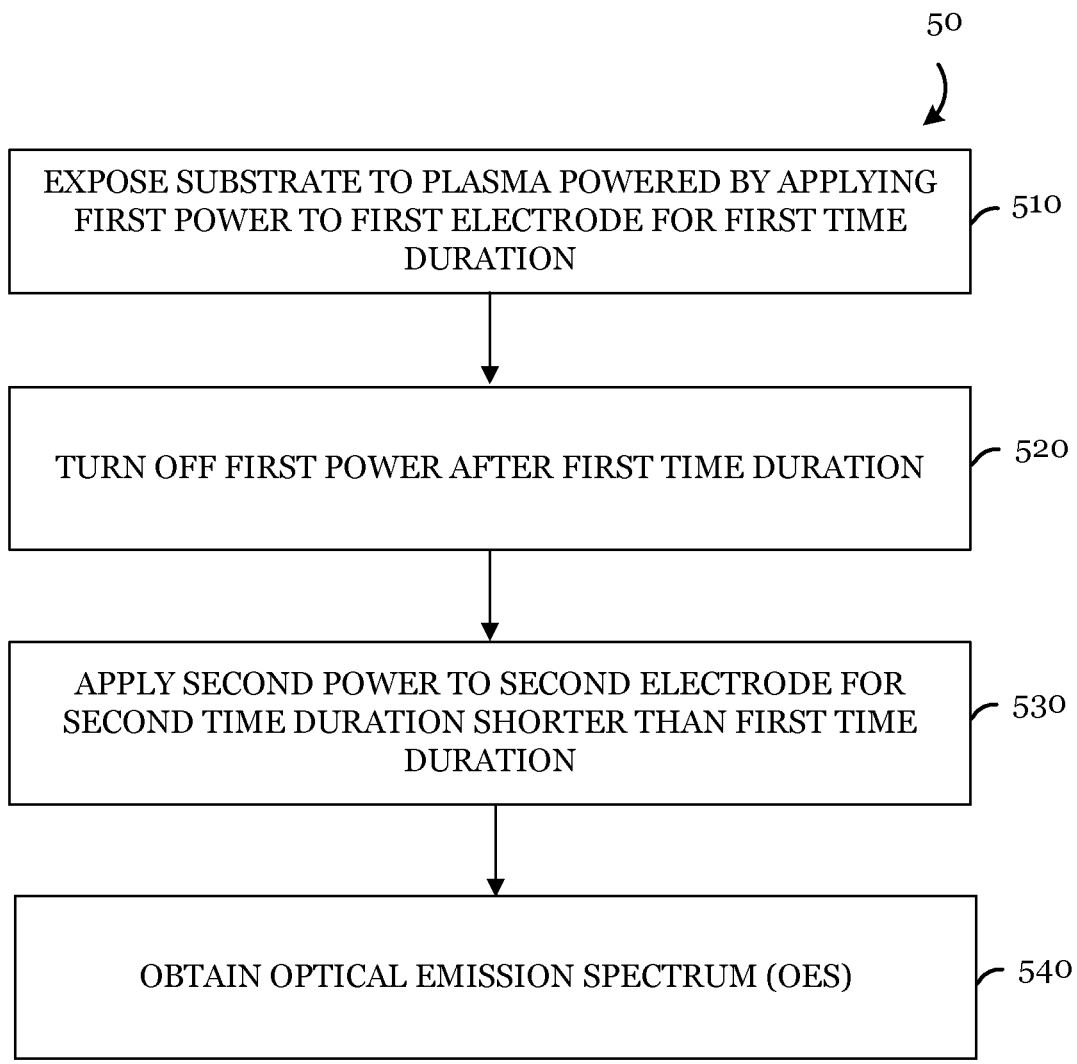
Figure 5B:
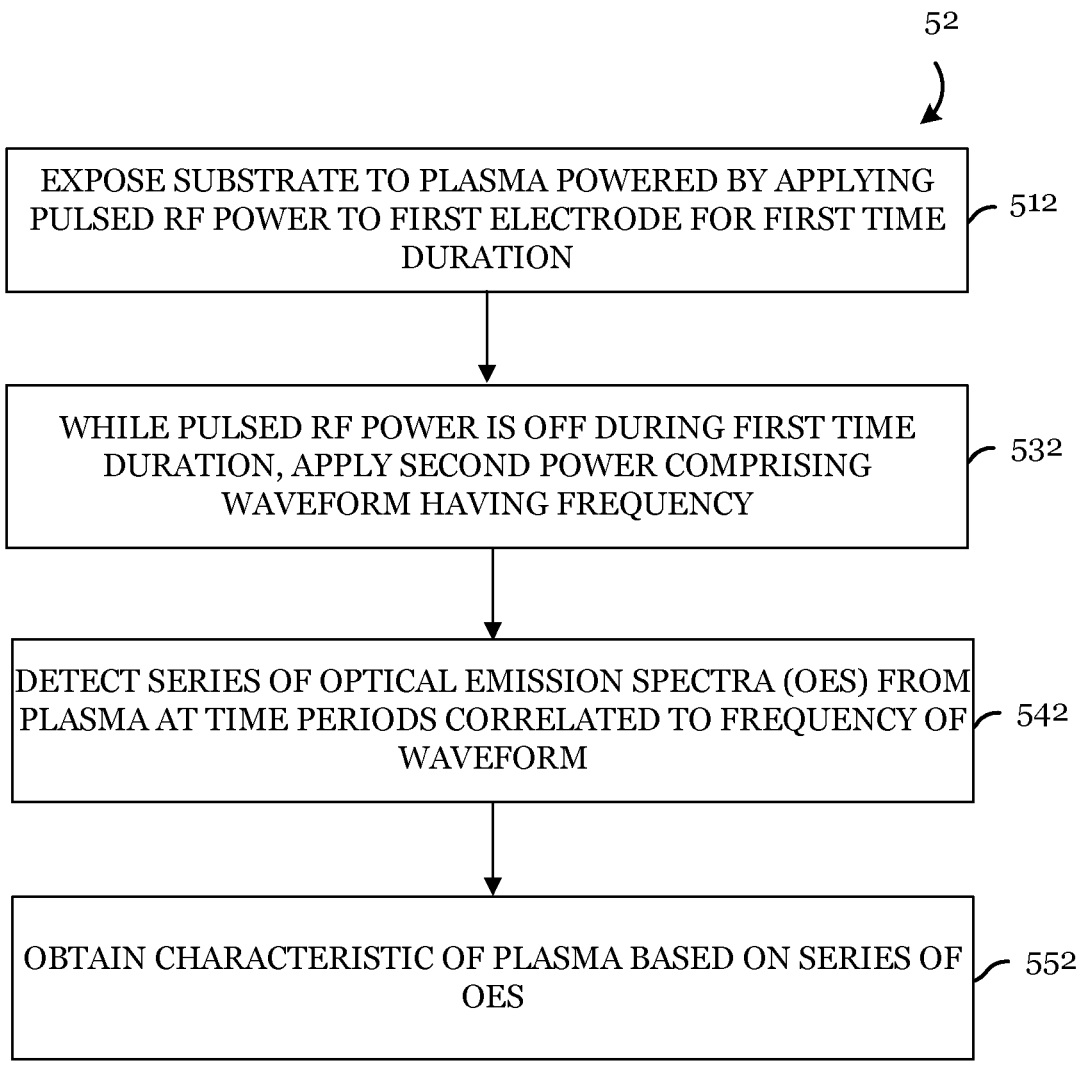

FIG. 4B illustrates another example timing diagram with reduced excitation pulsing for OES signal enhancement in accordance with another embodiment.

In FIG. 4B, the same series of power pulses for the source power 300 is illustrated, but the number of power spikes 310 (excitation pulsing) is reduced by half. A power spike is skipped for every other power OFF phase for the source power 300. Reducing the number of power spikes 310 and corresponding OES measurements may advantageously lower the risk of process disturbance. Although not illustrated, in other embodiments, the reduction of the number of power spikes 310 may be applied for any number of times with any pattern. In one embodiment, the reduction may be by a third, where a power spike is skipped for every three power OFF phase, for example.

Figure 4C:
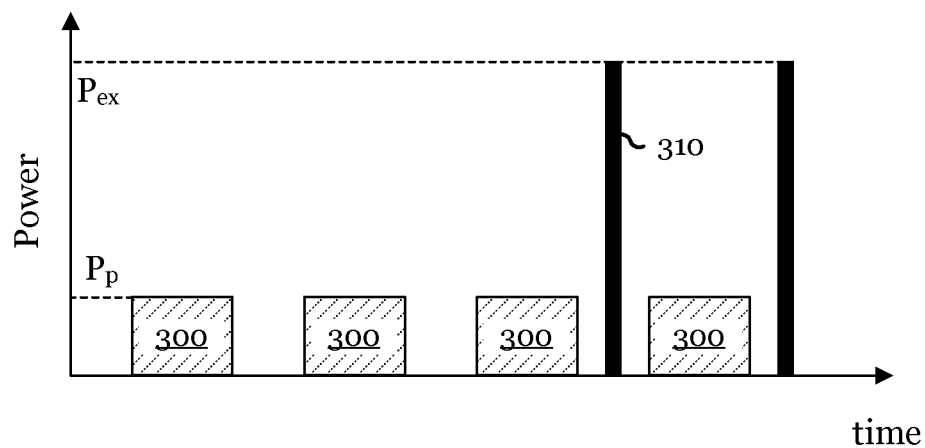

FIG. 4C illustrates yet another example timing diagram with delayed excitation pulsing for OES signal enhancement in accordance with yet another embodiment.

In FIG. 4C, the same series of power pulses for the source power 300 is illustrated, but the series of power spikes 310 (excitation pulsing) is started after some power pulses. In the illustrated example, the first power spike 310 is provided at the third power OFF phase for the source power 300. In alternate embodiments, the first power spike 310 may be provided after any number of power OFF phases, depending on a particular area of interest of the plasma process for OES diagnostics.

Figure 4D:
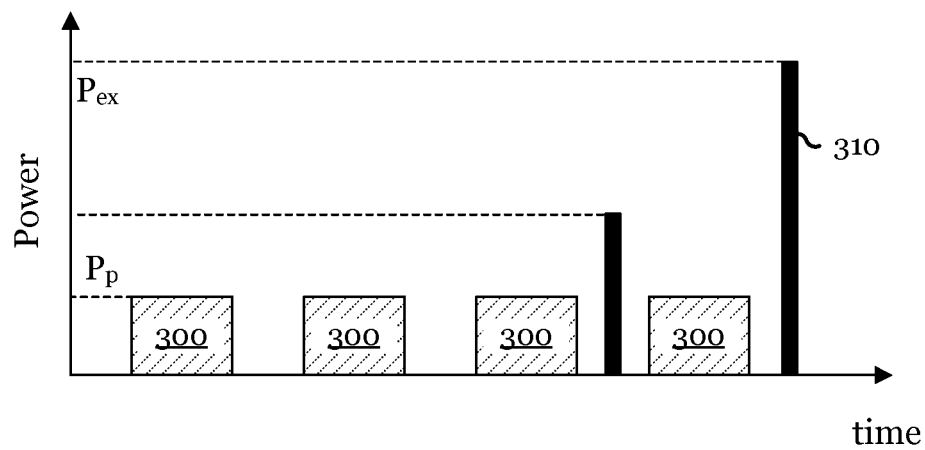

FIG. 4D illustrates yet another example timing diagram with excitation ramping in accordance with yet another embodiment.

In FIG. 4D, the power spikes 310 comprises spikes with power ramping, from a weak power level to a higher power level. In FIG. 4D, the same series of power pulses for the source power 300 is illustrated with the same delay illustrated in FIG. 4C. In one embodiment, the excitation power level for the power spikes 310 may be ramped for each spike stepwise. Such excitation power modulation during the OES data collection time period can provide additional information on the plasma and thereby the progress of plasma process. This may be particularly advantageous in characterizing more than one species that have different emission characteristics. Excitation power modulation may also be useful, when an optimal excitation power level for OES is not established beforehand, to dynamically determine the excitation power level necessary to achieve a target OES signal intensity.

Figure 4E:
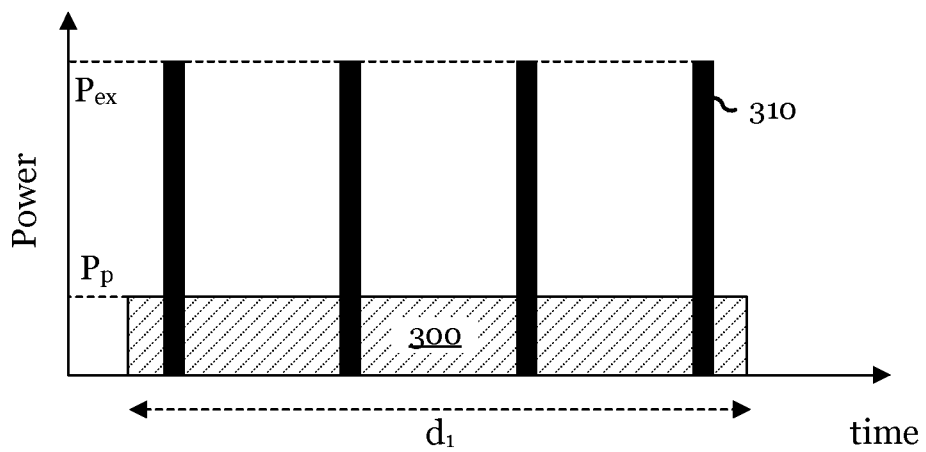

FIG. 4E illustrates yet another example timing diagram for a plasma process with power pulsing overlapped with source power in accordance with yet another embodiment.

In FIG. 4E, the power pulsing for OES signal enhancement allows power spikes 310 while the source power 300 is on. This embodiment may be applied to a pulsed plasma process, where the power spikes 310 (excitation pulsing) is provided during the power ON phases. Further, it may be applied to a non-pulsed low-power plasma process where the source power 300 alone may not be sufficient for OES signal detection. In these embodiments, it may be critical to consider the sum of the source power 300 and the power spikes 310 in order to enable sufficient OES signal enhancement and avoid process interference.

Yet in alternate embodiments, the methods of OES data collection with power pulsing for signal enhancement may be integrated as a part of a multi-step and/or cyclic plasma process. In certain embodiments, only a portion of the entire plasma process may use a low-power plasma that requires OES signal enhancement. Accordingly, such a plasma process may comprise a process step that OES data collection is possible without any additional power pulsing for OES signal enhancement and another step with the power pulsing.

Figure 4F:
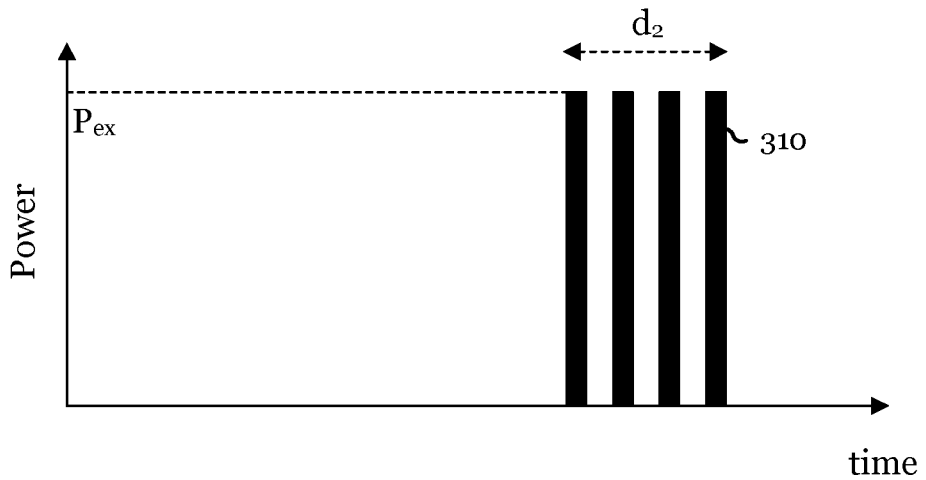

FIG. 4F illustrates yet another example timing diagram for a plasma-less process in accordance with yet another embodiment.

While this disclosure primarily describes the methods of OES data collection for a low-power plasma process, it is possible to further apply the methods to a plasma-less process, where the substrate is processed in the absence of a plasma, except a short time period when power pulsing (or a single power spike) may strike a plasma for OES measurements. In various embodiments, the total energy provided by the power pulsing may be limited to a level high enough for OES measurements but low enough such that no substantial interference to the plasma-less process should occur. In one example, the power pulsing may be performed within a power range of 1 W and 5 kW.

FIGS. 5A and 5B illustrates process flow charts of methods of OES data collection in accordance with various embodiments.

In FIG. 5A, a process flow 50 starts with exposing a substrate in a plasma processing chamber to a plasma powered by applying a first power to a first electrode of a plasma processing chamber for a first time duration (block 510). Next, the first power may be turned off after the first time duration (block 520). While the first power is off, a second power may be applied to a second electrode of the plasma processing chamber for a second time duration to excite species in the plasma processing chamber and enable optical emissions from the excited species (block 530). An optical emission spectrum (OES) may then collected from the excited species (block 540).

In FIG. 5B, a process flow 52 starts with exposing a substrate in a plasma processing chamber to a plasma powered by applying a pulsed RF power to a first electrode of a plasma processing chamber for a first time duration (block 512). While the pulsed RF power is off during the first time duration, a second power comprising a waveform having a frequency may be applied to a second electrode of the plasma processing chamber (block 532). Next, a series of optical emission spectra (OES) from the plasma may be detected at time periods correlated to the frequency of the waveform (block 542), and then a characteristic of the plasma may be obtained based on the series of OES (block 552).

Example embodiments of the invention are summarized here. Other embodiments can also be understood from the entirety of the specification as well as the claims filed herein.

Example 1. A method of processing a substrate that includes: exposing the substrate in a plasma processing chamber to a plasma powered by applying a first power to a first electrode of a plasma processing chamber; turning OFF the first power to the first electrode after the first time duration; while the first power is OFF, applying a second power to a second electrode of the plasma processing chamber for a second time duration, the second time duration being shorter than the first time duration, an energy of the second power over the second time duration is less than an energy of the first power over the first time duration by a factor of at least 2; and detecting an optical emission spectrum (OES) from species in the plasma processing chamber.

Example 2. The method of example 1, where applying the second power including a power pulse train, and further including detecting a series of OES from the species, a timing of one of the detecting the series of OES is correlated to the power pulse train.

Example 3. The method of one of examples 1 or 2, where applying the second power starts while the plasma is decaying and before the plasma is completely extinguished.

Example 4. The method of one of examples 1 to 3, where the first electrode and the second electrode are a same electrode.

Example 5. The method of one of examples 1 to 4, where the first time duration is between 30 sec and 600 sec.

Example 6. The method of one of examples 1 to 5, where the second time duration is between 1 µs and 100 ms.

Example 7. The method of one of examples 1 to 6, where the first power is applied as a RF power.

Example 8. The method of one of examples 1 to 7, where the first power is between 1 W and 500 W.

Example 9. A method of processing a substrate that includes: exposing the substrate in a plasma processing chamber to a plasma powered by applying a pulsed RF power to a first electrode of a plasma processing chamber for a first time duration, the pulsed RF power being pulsed at a first frequency; while the pulsed RF power is OFF during the first time duration, applying a second power including a waveform having a second frequency to a second electrode of the plasma processing chamber; detecting a series of optical emission spectra (OES) from the plasma, the series of OES being detected at time periods correlated to the second frequency of the waveform; and obtaining a characteristic of the plasma based on the series of OES.

Example 10. The method of example 9, where the first frequency is between 0.1 kHz and 100 kHz.

Example 11. The method of one of examples 9 or 10, where the waveform includes a plurality of maximums, where the timing of the OES detection for one of the periodically detecting is matched with one of the plurality of maximums.

Example 12. The method of one of examples 9 to 11, where the waveform includes a plurality of maximums, where the timing of the OES detection for one of the periodically detecting is offset from one of the plurality of maximums.

Example 13. The method of one of examples 9 to 12, where an energy of the second power is less than an energy of the pulsed RF power over the first time duration by a factor of at least 2.

Example 14. The method of one of examples 9 to 13, where the second frequency is between 1 Hz and 1 kHz.

Example 15. The method of one of examples 9 to 14, where the first electrode and the second electrode are a same electrode.

Example 16. An plasma processing system including: a plasma processing chamber configured to hold a substrate to be processed; a RF power source configured to generate a plasma in the plasma processing chamber; an optical emission spectroscopy (OES) detection device connected to the plasma processing chamber, the OES detection device being configured to measure OES signals from the plasma processing chamber during a process; an electrode connected to the OES detection device; a microprocessor; and a non-transitory memory storing a program to be executed in the microprocessor, the program including instructions to: perform an etch process on a substrate; during the etch process, apply a series of power pulses to the electrode of the plasma processing chamber to excite species in the plasma processing chamber; detecting a series of OES from the excited species from the plasma processing chamber, a timing of detecting the series of OES being correlated to a timing of the series of power pulses; and based on the series of OES, perform a temporal analysis of the excited species during the etch process.

Example 17. The plasma processing system of example 16, where a duration of the each power pulse is between 1 ms and 1 sec.

Example 18. The plasma processing system of one of examples 16 or 17, where no other power is provided while the each power pulse is applied.

Example 19. The plasma processing system of one of examples 16 to 18, where the electrode is also connected to the RF power source.

Example 20. The plasma processing system of one of examples 16 to 19, where the program further includes instructions to: power the RF power source and sustain a plasma in the plasma processing chamber, the RF power being pulsed at pulsing frequency between 0.1 kHz and 100 kHz; and expose the substrate to the plasma for the etch process.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of processing a substrate, the method comprising:
    exposing the substrate in a plasma processing chamber to a plasma powered by applying a first power to a first electrode of a plasma processing chamber;
    turning OFF the first power to the first electrode after a first time duration;
    while the first power is OFF, applying a second power to a second electrode of the plasma processing chamber for a second time duration, the second time duration being shorter than the first time duration, an energy of the second power over the second time duration is less than an energy of the first power over the first time duration by a factor of at least 2, the applying the second power exciting the plasma to generate an excited species; and
    detecting an optical emission spectrum (OES) from the excited species in the plasma processing chamber.

2. The method of claim 1, wherein applying the second power comprising a power pulse train, and further comprising detecting a series of OES from the excited species, a timing of one of the detecting the series of OES is correlated to the power pulse train.

3. The method of claim 1, wherein applying the second power starts while the plasma is decaying and before the plasma is completely extinguished.

4. The method of claim 1, wherein the first electrode and the second electrode are a same electrode.

5. The method of claim 1, wherein the first time duration is between 30 sec and 600 sec.

6. The method of claim 1, wherein the second time duration is between 1 µs and 100 ms.

7. The method of claim 1, wherein the first power is applied as a RF power.

8. The method of claim 1, wherein the first power is between 1 W and 500 W.

9. A method of processing a substrate, the method comprising:
    exposing the substrate in a plasma processing chamber to a plasma powered by applying a pulsed RF power to a first electrode of a plasma processing chamber for a first time duration, the pulsed RF power being pulsed at a first frequency;
    while the pulsed RF power is OFF during the first time duration, applying a second power comprising a waveform having a second frequency to a second electrode of the plasma processing chamber;
    detecting a series of optical emission spectra (OES) from the plasma, the series of OES being detected at time periods correlated to the second frequency of the waveform; and
    obtaining a characteristic of the plasma based on the series of OES.

10. The method of claim 9, wherein the first frequency is between 0.1 kHz and 100 kHz.

11. The method of claim 9, wherein the waveform comprises a plurality of maximums, wherein timings of each of the series of OES are matched with one of the plurality of maximums.

12. The method of claim 9, wherein the waveform comprises a plurality of maximums, wherein timings of each of the series of OES are offset from one of the plurality of maximums.

13. The method of claim 9, wherein an energy of the second power is less than an energy of the pulsed RF power over the first time duration by a factor of at least 2.

14. The method of claim 9, wherein the second frequency is between 1 Hz and 1 kHz.

15. The method of claim 9, wherein the first electrode and the second electrode are a same electrode.

16. A plasma processing system comprising:
    a plasma processing chamber configured to hold a substrate to be processed;
    a RF power source configured to generate a plasma in the plasma processing chamber;
    an optical emission spectroscopy (OES) detection device connected to the plasma processing chamber, the OES detection device being configured to measure OES signals from the plasma processing chamber during a process;
    an electrode connected to the OES detection device;
    a microprocessor; and
    a non-transitory memory storing a program to be executed in the microprocessor, the program comprising instructions to:
        perform an etch process on a substrate;
        during the etch process, apply a series of power pulses to the electrode of the plasma processing chamber to excite species in the plasma processing chamber;
        detecting a series of OES from the excited species from the plasma processing chamber, a timing of detecting the series of OES being correlated to a timing of the series of power pulses; and
        based on the series of OES, perform a temporal analysis of the excited species during the etch process.

17. The plasma processing system of claim 16, wherein a duration of each of the series of power pulses is between 1 ms and 1 sec.

18. The plasma processing system of claim 16, wherein no other power is provided while each of the series of power pulses is applied.

19. The plasma processing system of claim 16, wherein the electrode is also connected to the RF power source.

20. The plasma processing system of claim 19, wherein the program further comprises instructions to:

power the RF power source and sustain a plasma in the plasma processing chamber, the RF power source being pulsed at pulsing frequency between 0.1 kHz and 100 kHz; and expose the substrate to the plasma for the etch process.

* * * * *